United States Patent
Arai

(10) Patent No.: US 9,543,453 B2
(45) Date of Patent: Jan. 10, 2017

(54) SEMICONDUCTOR DEVICE INCLUDING JUNCTION FIELD EFFECT TRANSISTOR AND METHOD OF MANUFACTURING THE SAME

(71) Applicant: Renesas Electronics Corporation, Kawasaki-shi (JP)

(72) Inventor: Koichi Arai, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 52 days.

(21) Appl. No.: 14/469,799

(22) Filed: Aug. 27, 2014

(65) Prior Publication Data

US 2015/0214385 A1 Jul. 30, 2015

(30) Foreign Application Priority Data

Jan. 24, 2014 (JP) .................. 2014-010876

(51) Int. Cl.
*H01L 29/808* (2006.01)
*H01L 29/66* (2006.01)
*H01L 29/10* (2006.01)
*H01L 29/16* (2006.01)
*H01L 21/04* (2006.01)

(52) U.S. Cl.
CPC ......... *H01L 29/8083* (2013.01); *H01L 21/046* (2013.01); *H01L 29/1066* (2013.01); *H01L 29/1608* (2013.01); *H01L 29/66068* (2013.01); *H01L 29/1058* (2013.01); *H01L 29/66909* (2013.01)

(58) Field of Classification Search
CPC ................................. H01L 29/66909
See application file for complete search history.

(56) References Cited

U.S. PATENT DOCUMENTS

| | | | |
|---|---|---|---|
| 7,211,845 B1 * | 5/2007 | Yu | H01L 29/1029 |
| | | | 257/263 |
| 2005/0067630 A1 | 3/2005 | Zhao | |
| 2006/0197105 A1 | 9/2006 | Carta et al. | |
| 2010/0163935 A1 | 7/2010 | Shimizu et al. | |
| 2014/0231883 A1 * | 8/2014 | Esteve | H01L 29/66909 |
| | | | 257/265 |

FOREIGN PATENT DOCUMENTS

JP  2010-147405 A  7/2010

OTHER PUBLICATIONS

Extended European Search Report dated May 27, 2015.

* cited by examiner

*Primary Examiner* — Stephen W Smoot
(74) *Attorney, Agent, or Firm* — McGinn IP Law Group, PLLC.

(57) ABSTRACT

An on-resistance of a junction FET is reduced. In a semiconductor device in an embodiment, a gate region of the junction field effect transistor includes a low concentration gate region and a high concentration gate region whose impurity concentration is higher than an impurity concentration of the low concentration gate region, and the high concentration gate region is included in the low concentration gate region.

11 Claims, 16 Drawing Sheets

SEMICONDUCTOR DEVICE INCLUDING JUNCTION FIELD EFFECT TRANSISTOR AND METHOD OF MANUFACTURING THE SAME

CROSS-REFERENCE TO RELATED APPLICATION

The present application claims priority from Japanese Patent Application No. 2014-010876 filed on Jan. 24, 2014, the content of which is hereby incorporated by reference into this application.

TECHNICAL FIELD OF THE INVENTION

The present invention relates to a semiconductor device and a technique of manufacturing the same. For example, the present invention relates to a technique effectively applied to a semiconductor device which includes a junction field effect transistor (junction FET (Junction Field Effect Transistor)) and a technique of manufacturing the semiconductor device.

BACKGROUND

Japanese Patent Application Laid-open Publication No. 2010-147405 (Patent Document 1) describes a technique to achieve both improvement of a break-down voltage and reduction in an on-resistance in a normally off type junction FET. Specifically, the Patent Document describes a technique in a junction FET using silicon carbide as a substrate material, the technique introducing an impurity into the vicinity of a p-n junction between a gate region and a channel formation region, the impurity having a reverse conductivity type against an impurity introduced in the gate region but the same conductivity type as an impurity introduced in the channel formation region.

SUMMARY

For example, although it is desirable to reduce an on-resistance from a viewpoint of improving a performance of the junction FET, has there is a room for improvement of a current junction FET from a viewpoint of reducing the on-resistance.

Other preferred aims and novel characteristics will be apparent from the description of the present specification and the accompanying drawings.

In a semiconductor device in an embodiment, a gate region of the junction field effect transistor has a low concentration gate region and a high concentration gate region whose impurity concentration is higher than that of the low concentration gate region, and the high concentration gate region is included in the low concentration gate region.

In addition, a method of manufacturing a semiconductor device in an embodiment is provided with a process of forming a pair of gate regions below a bottom of a pair of trenches, and this process has a process of forming the low concentration gate region below each bottom of the pair of trenches, and a process of forming the high concentration gate region in a region which is below each bottom of the pair of trenches and which is narrower than a formation region of the low concentration gate region.

According to an embodiment, a performance of the junction FET can be improved.

BRIEF DESCRIPTIONS OF THE DRAWINGS

DETAILED DESCRIPTION

Figure 1:
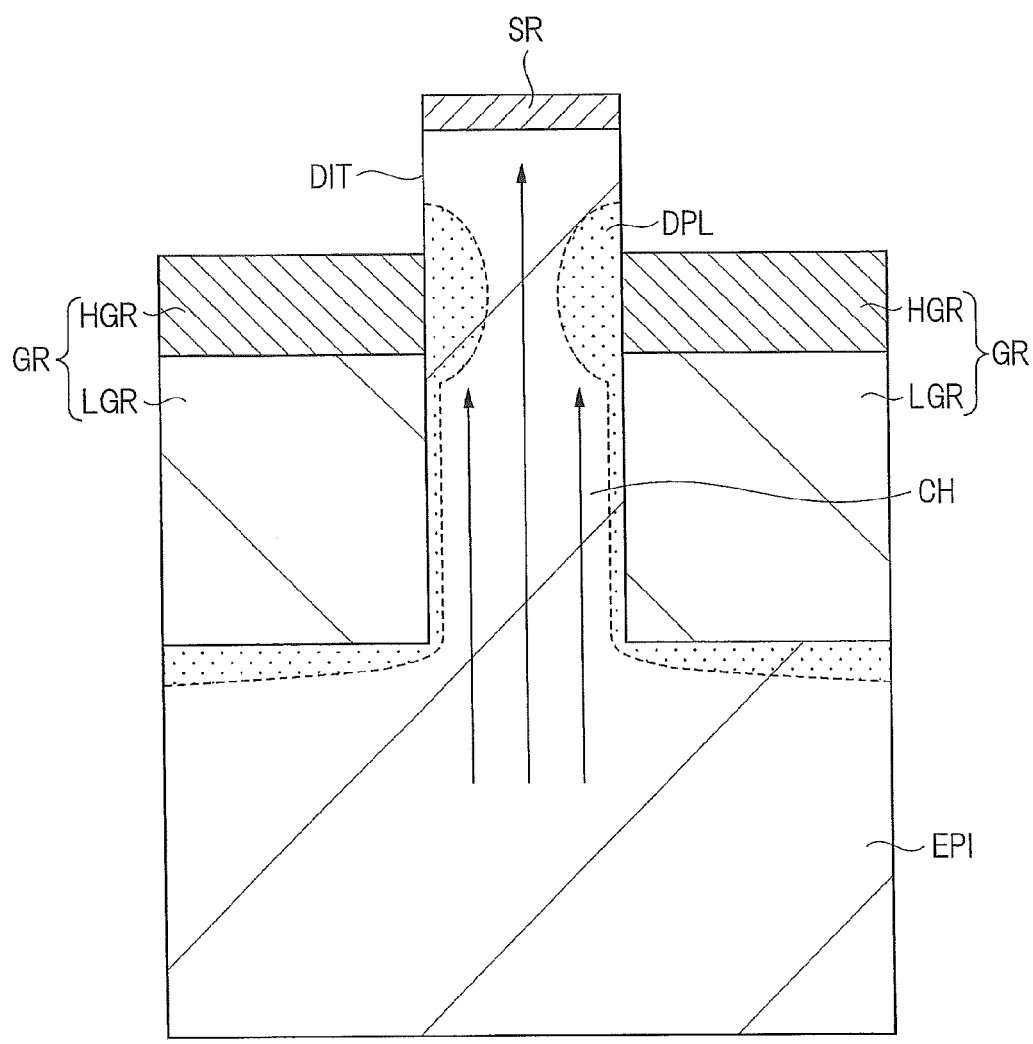
FIG. 1 is a cross-sectional view illustrating a schematic device structure of a junction FET in a related technique.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted. Note that hatching is used even in a plan view so as to make the drawings easy to see.

(First Embodiment)
<Description of Related Technique>

In a field of a power MOSFET which is one of power semiconductor devices, a Si power MOSFET using a silicon substrate (Si substrate) is a mainstream. However, a SiC power MOSFET using a silicon carbide substrate (SiC substrate) has an advantage achieving a higher break-down voltage and lower loss than those of the Si power MOSFET. This is because the silicon carbide has a larger break-down voltage because of being larger in a band gap than silicon, and, as the result, the break-down voltage can be secured even when an epitaxial layer (drift layer) is thinned. That is, the SiC power MOSFET has such advantages as securing the break-down voltage even when the epitaxial layer is thinned and as reducing an on-resistance of the SiC power MOSFET since the epitaxial layer is thin. Therefore, an attention has been attracted on, for example, the SiC power MOSFET in a field of an inverter technique of a power-saving type or an environment-conscious type.

However, in the SiC power MOSFET, it is difficult to form a favorable gate insulating film, and therefore, it is known that there is a room for improvement from a viewpoint of improving reliability. From this, as the SiC power MOSFET, an attention has been attracted on a junction FET without using the gate insulating film. Hereinafter, a configuration example of this junction FET will be described.

FIG. 1 is a cross-sectional view illustrating a schematic device structure of the junction FET in a related technique. In FIG. 1, the junction FET in the related technique has an epitaxial layer EPI with, for example, an n-type impurity represented by nitrogen (N) introduced into silicon carbide, and a source region SR is formed on a surface of this epitaxial layer EPI. This source region SR is also formed from an n-type semiconductor region with nitrogen introduced into the silicon carbide. Then, a lower layer of the source region SR becomes a channel region CH, and a pair of trenches DIT are formed on a surface of the epitaxial layer EPI which sandwiches the source region SR. Furthermore, a gate region GR is formed below each bottom surface of the pair of trenches DIT. Therefore, in the junction FET in the related technique, a pair of gate regions GR are formed so as to sandwich the channel region CH.

This gate region GR is formed from a low concentration gate region LGR whose impurity concentration is low and a high concentration gate region HGR whose impurity concentration is higher than that of this low concentration gate region LGR, and the high concentration gate region HGR is arranged on the low concentration gate region LGR. Then, in the junction FET in the related technique, both regions of the low concentration gate region LGR and the high concentration gate region HGR are directly in contact with the channel region CH.

The low concentration gate region LGR is formed from a p-type semiconductor region with a p-type impurity represented by aluminum (Al) introduced into the silicon carbide, and the high concentration gate region HGR is also formed from a p-type semiconductor region with a p-type impurity introduced into the silicon carbide. Here, the high concentration gate region HGR is formed for, for example, obtaining a favorable ohmic contact between the high concentration gate region HGR and a silicide layer (not illustrated) formed on a surface of the gate region GR.

The junction FET in the related technique is made up as described above, and an operation will be described briefly below. In FIG. 1, when an on-operation of the junction FET is performed, an electric potential difference between the source region SR and the gate region GR is made to become 0 V. In this case, since an extension of a depletion layer DPL extended from a p-n junction formed in a boundary region between the channel region CH and the gate region GR is small, most part of the channel region CH is not depleted. From this, when an electric potential difference by which an electric potential of the drain region is high is applied between the source region SR and drain region (epitaxial layer EPI) which sandwich the channel region CH, an electric current flows from the drain region to the source region SR through the channel region CH which has not been depleted. In this manner, the on-operation of the junction FET is performed.

On the other hand, in FIG. 1, when an off-operation of the junction FET is performed, an electric potential difference between the source region SR and the gate region GR is made to become negative. That is, a lower voltage than that of the source region SR is applied to the gate region GR. In this case, a reverse bias is applied to the p-n junction formed in the boundary region between the channel region CH and the gate region GR. As the result, since the extension of the depletion layer DPL extended from the p-n junction formed in the boundary region between the channel region CH and the gate region GR becomes large, the depletion layers DPL extended from the pair of gate regions GR which sandwich the channel region CH therebetween are joined, so that the whole channel region CH is depleted. Since the depleted channel region CH is functioned as an insulating region, an electric current does not flow due to the depleted channel region CH even when an electric potential difference is generated between the drain region and the source region SR. In this manner, the off-operation of the junction FET is performed. From descriptions above, in the junction FET, the on/off-operation can be performed by controlling the electric potential applied to the gate region GR so as to adjust the depletion layer DPL extended in the channel region CH.

Here, according to the present inventor's studies, it has become clear that there is a room for improvement from the viewpoint of reducing the on-resistance in the junction FET in the related technique described above, and therefore, the room for improvement in the related technique will be described below.

<Room for Improvement in Related Technique>

In FIG. 1, in the junction FET in the related technique, not only the low concentration gate region LGR but also the high concentration gate region HGR is formed so as to be directly in contact with the channel region CH. In this case, also in the on-state of the junction FET, the depletion layer DPL is extended to the channel region CH side in the channel region CH which is in contact with the high concentration gate region HGR.

Hereinafter, a reason for this will be described. For example, in the p-n junction, the p-type semiconductor region and the n-type semiconductor region are in contact with each other. The p-type semiconductor region is a semiconductor region using a large number of electron holes as a carrier, and the n-type semiconductor region is a semiconductor region using a large number of electrons as a carrier. Therefore, for example, when an attention is paid to the electron hole in the p-n junction where the p-type semiconductor region and the n-type semiconductor region come in contact with each other, a large number of electron holes exist in the p-type semiconductor region whereas only a small number of electron holes exist in the n-type semiconductor region since the electron hole is a minority carrier. This means that a hole concentration of the p-type semiconductor region and a hole concentration of the n-type semiconductor region are remarkably different from each other, and a positive hole current (diffusion current) tends to flow from the p-type semiconductor region toward the n-type semiconductor region in the p-n junction due to this difference between the hole concentration of the p-type semiconductor region and the hole concentration of the n-type semiconductor region. Then, annihilation of the electron hole flowed into the n-type semiconductor region against the electron which is the majority carrier in the n-type semiconductor region is caused, so that the depletion layer DPL where the carrier hardly exists is formed in the n-type semiconductor region. In the depletion layer DPL formed in this n-type semiconductor region, while the electrons which are the majority carrier hardly exist due to the annihilation against the electron holes which flowed from the p-type semiconductor region, positive electric charges resulting from donors are left as fixed electric charges. Therefore, in the depletion layer DPL, implantation of the positive hole current from the p-type semiconductor region is suppressed by a depletion layer electric field caused by the positive electric charges resulting from the donors. Then, finally, the depletion layer DPL is extended so that the inflow of the positive hole current resulting from the difference in the concentration between the hole concentration of the p-type semiconductor region and the hole concentration of the n-type semiconductor region is balanced with the depletion layer electric field caused by the positive electric charges resulting from the donors existing in the depletion layer DPL, and the inflow of the positive hole is stopped.

From descriptions above, it is required to make an area of the depletion layer electric field larger for inhibiting the inflow of the positive hole current (diffusion current) as the difference in the concentration between the hole concentration of the p-type semiconductor region and the hole concentration of the n-type semiconductor region is larger, and this means that the depletion layer is extended. Therefore, as illustrated in FIG. 1, a width of the depletion layer DPL extended in the channel region CH which is in contact with the high concentration gate region HGR becomes larger than a width of the depletion layer DPL extended in the channel region CH which is in contact with the low concentration gate region LGR. As the result, in the junction FET in the related technique illustrated in FIG. 1, a current passage in the vicinity of the region of the channel region CH which is in contact with the high concentration gate region HGR is narrowed since the width of the depletion layer DPL extended in the channel region CH which is in contact with the high concentration gate region HGR becomes large. This means that the on-resistance in the junction FET becomes large. From this, in the junction FET in the related technique, it is found that there is the room for improvement of the large on-resistance of the junction FET resulting from the direct contact of the high concentration gate region HGR with the channel region CH.

Accordingly, in the present first embodiment, the room for the improvement in the above-described related technique has been devised. Specifically, in the present first embodiment, such a devisal as reducing the on-resistance of the junction FET is performed. Hereinafter, a technical idea in the present first embodiment to which this devisal is applied will be described.

<Configuration of Junction FET in First Embodiment>

Figure 2:
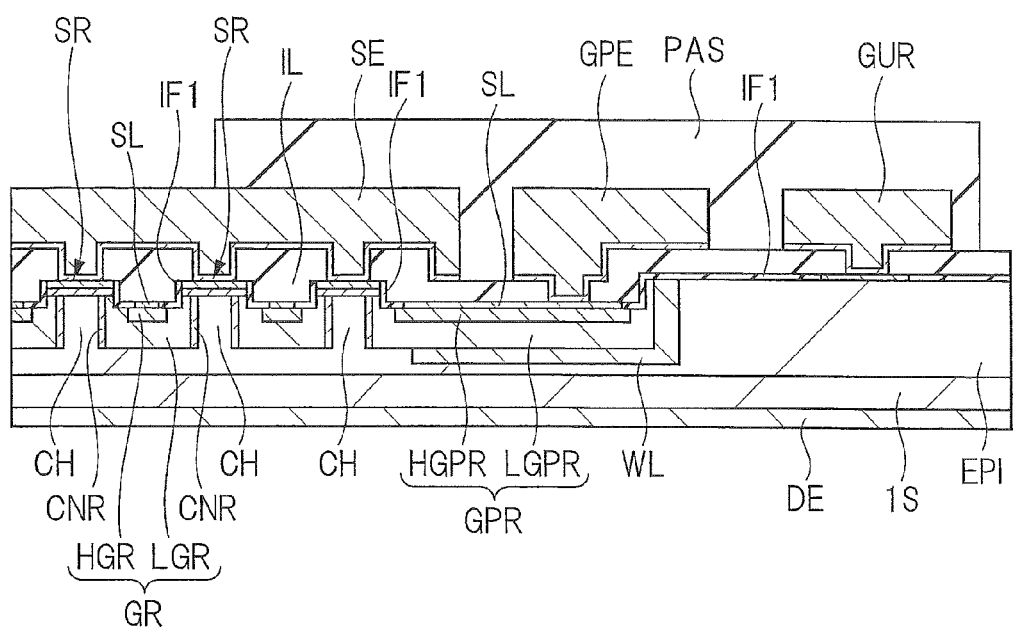
FIG. 2 is a cross-sectional view illustrating a configuration of the junction FET in a first embodiment.

FIG. 2 is a cross-sectional view illustrating a configuration of the junction FET in the present first embodiment. In FIG. 2, the junction FET in the present first embodiment has a semiconductor substrate 1S containing silicon carbide as a main component, for example, and the epitaxial layer EPI with, for example, the n-type impurity represented by nitrogen (N) introduced into the silicon carbide is formed on a main surface (upper surface) of this semiconductor substrate 1S. That is, the epitaxial layer EPI is also formed with the silicon carbide contained as a main component.

Here, the "main component" means a most-contained material component among component materials forming a member (layer), and, for example, "the semiconductor substrate 1S containing silicon carbide as the main component" means that the silicon carbide is most contained as the material of the semiconductor substrate 1S. Similarly, "the epitaxial layer EPI containing the silicon carbide as the main component" means that the silicon carbide is most contained as the material of the epitaxial layer EPI. The usage of the word "main component" in the present specification is intended to express that a case containing other impurities is not excluded while, for example, the semiconductor substrate 1S and the epitaxial layer EPI are basically made of the silicon carbide.

Next, in the epitaxial layer EPI, the channel region CH made up from the n-type semiconductor region is formed. That is, the channel region CH is made up from the n-type semiconductor region with the n-type impurity (donor) such as nitrogen (N) introduced into the silicon carbide. Then, the gate region GR is formed so as to sandwich the channel region CH. This gate region GR is made up from the p-type semiconductor region with, for example, the p-type impurity (acceptor) represented by aluminum introduced into the silicon carbide.

Furthermore, in the present first embodiment, a counter doped region CNR is formed between the gate region GR and the channel region CH, the counter doped region being made up from the n-type semiconductor region with the n-type impurity represented by nitrogen introduced into the silicon carbide. This counter doped region CNR has a function which makes steep the p-n junction formed between the gate region GR and the channel region CH, and is made up from the n-type semiconductor region whose impurity concentration is higher than that in the channel region CH.

The gate region GR is made up from the low concentration gate region LGR and the high concentration gate region HGR whose impurity concentration is higher than that of the low concentration gate region LGR, and the high concentration gate region HGR is included in the low concentration gate region LGR. Therefore, in the present first embodiment, the high concentration gate region HGR is not directly in contact with the channel region CH. In other words, it can also be said that a part of the low concentration gate region LGR is interposed between the channel region CH and the high concentration gate region HGR. In addition, since the high concentration gate region HGR is included in the low concentration gate region LGR, the bottom surface of the high concentration gate region HGR is formed at a position shallower than the bottom surface of the low concentration gate region LGR.

Then, by forming the silicide layer SL on the high concentration gate region HGR so that the high concentration gate region HGR is formed so as to be directly in contact with the silicide layer SL, the ohmic contact between the gate region GR and the silicide layer SL can be secured. This silicide layer SL is provided for decreasing a resistance of the gate region GR.

On the other hand, the source region SR made up from, for example, the n-type semiconductor region with nitrogen introduced into the silicon carbide is formed on the channel region CH, and the silicide layer SL for decreasing the resistance is formed also on a surface layer of this source region SR. At this time, an insulating film IF1 is formed in order to prevent electrical connection between the silicide layer SL formed on the surface layer of the source region SR and the silicide layer SL formed on the high concentration gate region HGR.

Next, while an upper side of the gate region GR is covered with, for example, an interlayer insulating film IL which is made up from a silicon oxide film, and has openings which penetrate through this interlayer insulating film IL formed so that the openings reach a plurality of source regions SR, respectively. Then, for example, a source electrode SE is formed so as to fill each of the plurality of openings. That is, the plurality of source regions SR are connected to each other by the source electrode SE. This source electrode SE is made up from, for example, a barrier conductor film including a laminated film of a titanium film and a titanium nitride film, and an aluminum film formed on the barrier conductor film. Note that, for example, a drain electrode IDE made up from a titanium film, a nickel film and a gold film is formed, on a rear surface (lower surface) of the semiconductor substrate 1S.

In the junction FET made up as described above, the channel region CH is made up as the current passage so that the electric current flows from the drain electrode DE to the source electrode SE, and a voltage applied to the pair of gate regions GR which sandwich the channel region CH is controlled, so that conduction or non-conduction of the channel region CH which is the current passage is controlled.

That is, when the on-operation of the junction FET is performed, the difference in the electric potential between the source electrode SE and the gate region GR is made to become 0 V. In this case, since the extension of the depletion layer extended from the p-n junction formed in the boundary region between the channel region CH and the gate region GR is small, most part of the channel region CH is not depleted. From this, when such an electric potential difference as increasing an electric potential of the drain region is applied between the source electrode SE which sandwiches the channel region CH and the drain electrode DE, the electric current flows from the drain region to the source region SR through the channel region CH which is not depleted. In this manner, the on-operation of the junction FET is performed.

On the other hand, when the off-operation of the junction FET is performed, the difference in the electric potential between the source electrode SE and the gate region GR is made to be negative. That is, a lower voltage than that of the source electrode SE is applied to the gate region GR. In this case, a reverse bias is applied to the p-n junction formed in the boundary region between the channel region CH and the gate region GR. As the result, the extension of the depletion layer extended from the p-n junction formed in the boundary region between the channel region CH and the gate region GR becomes large, and therefore, the depletion layer extended from each of the pair of gate regions GR which sandwich the channel region CH is joined, and the whole channel region CH is depleted. Since the depleted channel region CH is functioned as the insulating region, the electric current does not flow due to the depleted channel region CH even when the difference in the electric potential is generated between the drain electrode DE and the source electrode SE. In this manner, the off-operation of the junction FET is performed.

Next, as illustrated in FIG. 2, in the outside of a junction FET formation region in which the junction FET is formed, a gate lead-out region GPR is formed. Specifically, a well WL which relaxes electric field concentration is formed in the epitaxial layer EPI, and the gate lead-out region GPR is formed so as to be in contact with this well WL. The gate lead-out region GPR is made up from a low concentration gate lead-out region LGPR and a high concentration gate lead-out region HGPR, and the high concentration gate lead-out region HGPR is included in the low concentration gate lead-out region LGPR. Then, the silicide layer SL is formed on the high concentration gate lead-out region HGPR, and the interlayer insulating film IL is formed so as to cover this silicide layer SL. On this interlayer insulating film IL, an opening which reaches the silicide layer SL formed on the high concentration gate lead-out region HGPR is formed, and the gate lead-out electrode GPE is formed so as to fill this opening. Therefore, the gate lead-out region GPR is connected electrically with the gate lead-out electrode GPE.

Next, a guard ring GUR is formed in the outside of the gate lead-out region GPR. Specifically, the interlayer insulating film IL is formed so as to cover the epitaxial layer EPI, and an opening which reaches the epitaxial layer EPI is formed in this interlayer insulating film IL. Then, the guard ring GUR is formed so as to fill this opening. Furthermore, a surface protection film PAS made up from, for example, a polyimide resin film is formed so as to cover the source electrode SE, the gate lead-out electrode GPE and the guard ring GUR. In such a manner as described above, the semiconductor device in the present first embodiment is configured.

<Feature in First Embodiment>

Figure 3:
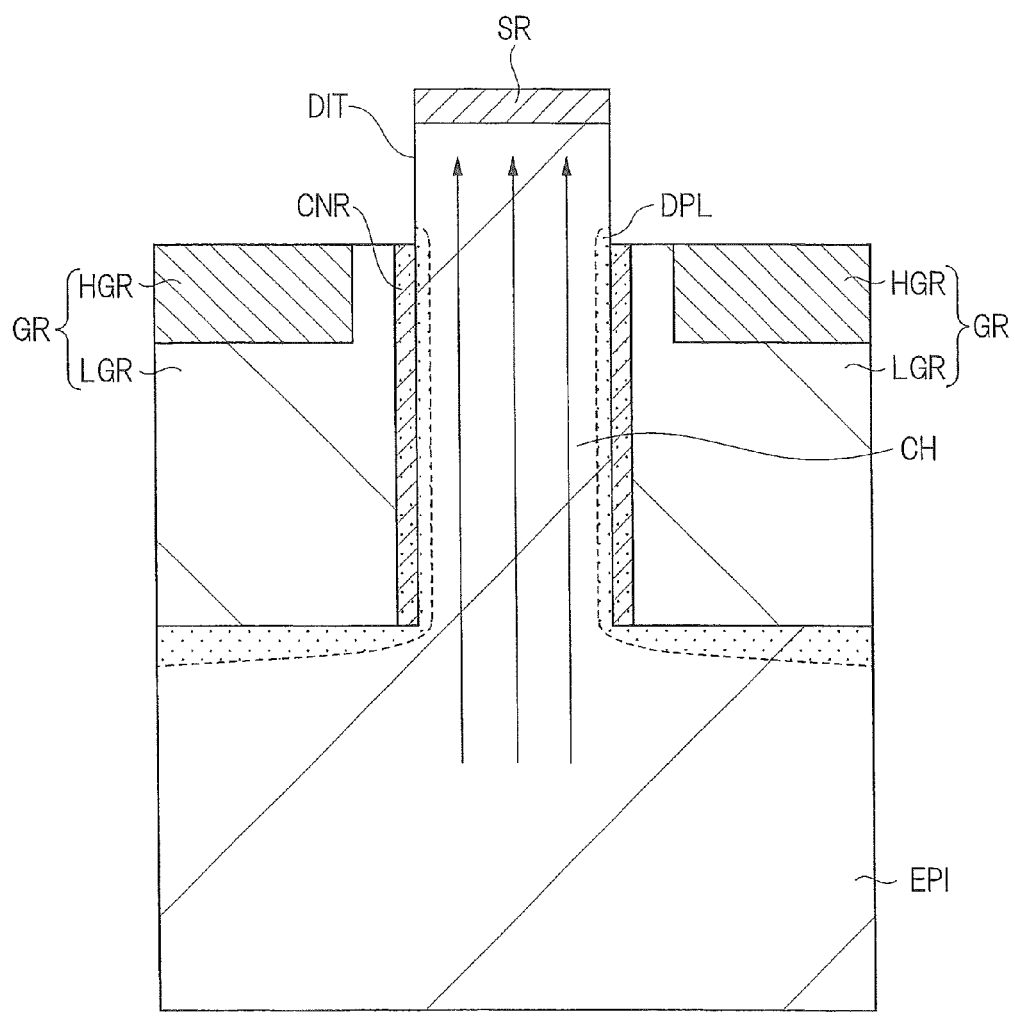
FIG. 3 is a schematic view illustrating the junction FET in the first embodiment while being enlarged.

Next, the feature in the present first embodiment will be described. FIG. 3 is a schematic view illustrating the junction FET in the first embodiment while being enlarged. In FIG. 3, the source region SR is formed on the channel region CH formed in the epitaxial layer EPI, and a pair of trenches DIT are formed in the epitaxial layer EPI so as to sandwich this source region SR. Then, the gate region GR is formed below each bottom of the pair of trenches DIT. This gate region GR is made up from the low concentration gate region LGR and the high concentration gate region HGR. In this manner, while a pair of the gate regions GR are formed so as to sandwich the channel region CH, the counter doped region CNR is further formed between the channel region CH and the gate region GR. In such a manner as described above, the junction FET in the present first embodiment is configured.

Here, a first feature point of the present first embodiment is that the high concentration gate region HGR is included in the low concentration gate region LGR in the gate region GR as illustrated in FIG. 3. By this point, the high concentration gate region HGR is not directly in contact with the channel region CH (counter doped region CNR). As the result, even in the on-state of the junction FET, the extension of the depletion layer DPL onto the channel region CH side in the channel region CH which is not in contact with the high concentration gate region HGR can be suppressed. This is because it is required to increase an area of the depletion layer electric field provided for inhibiting the inflow of the positive hole current (diffusion current) as the difference in the concentration between the hole concentration of the gate region GR (p-type semiconductor region) and the hole concentration of the channel region CH (n-type semiconductor region) is larger, and this means the extension of the depletion layer DPL. That is, when the difference in the concentration between the hole concentration of the gate region GR (p-type semiconductor region) and the hole concentration of the channel region CH (n-type semiconductor region) becomes small, the depletion layer electric field provided for inhibiting the inflow of the positive hole current (diffusion current) may be small, and this means that the extension of the depletion layer DPL is suppressed.

With respect to this point, in the related technique illustrated in FIG. 1, for example, the high concentration gate region HGR is not included in the low concentration gate region LGR, and the high concentration gate region HGR is configured to be directly in contact with the channel region CH. In this case, the width of the depletion layer DPL extended in the channel region CH which is in contact with the high concentration gate region HGR becomes larger than the width of the depletion layer DPL extended in the channel region CH which is in contact with the low concentration gate region LGR. As a result, in the junction FET in the related technique illustrated in FIG. 1, the width of the depletion layer DPL extended in the channel region CH which is in contact with the high concentration gate region HGR becomes large, and therefore, the current passage in the vicinity of a part of the channel region CH which is in contact with the high concentration gate region HGR is narrowed. This means that the on-resistance in the junction FET becomes large. From this, in the junction FET in the related technique, the on-resistance of the junction FET becomes large resulting from the direct contact of the high concentration gate region HGR with the channel region CH.

On the other hand, in the junction FET in the present first embodiment, the high concentration gate region HGR is included in the low concentration gate region LGR, and the high concentration gate region HGR is configured so as not to be directly in contact with the channel region CH (counter doped region CNR). In this case, in all the boundary regions between the gate region GR and the channel region CH (counter doped region CNR), the low concentration gate region LGR and the channel region CH (counter doped region CNR) are in contact with each other. In other words, in the junction FET in the present first embodiment, in the boundary region between the gate region GR and the channel region CH (counter doped region CNR), the contact of the high concentration gate region HGR with the channel region CH (counter doped region CNR) can be avoided. Therefore, according to the junction FET in the present first embodiment in which the high concentration gate region HGR is not directly in contact with the channel region CH (counter doped region CNR), the difference in the concentration between the hole concentration of the gate region GR (p-type semiconductor region) and the hole concentration of the channel region CH (n-type semiconductor region) is smaller than that of the related technique configured so that the high concentration gate region HGR is directly in contact with the channel region CH. From this, in the junction FET in the present first embodiment, the depletion layer electric field for inhibiting the inflow of the positive hole current (diffusion current) is not larger than that of the junction FET in the related technique. As a result, the extension of the depletion layer DPL toward the channel region CH side is suppressed in the boundary region between the gate region GR and the channel region CH (counter doped region CNR). As described above, in the junction FET in the present first embodiment illustrated in FIG. 3, the width of the depletion layer DPL extended to the channel region CH side is suppressed, and therefore, the current passage of the channel region CH can be suppressed from becoming narrowed due to the extension of the depletion layer DPL. This means that the on-resistance of the junction FET in the present first embodiment can be reduced lower than that of the junction FET in the related technique. From this, in the present first embodiment, the on-resistance can be reduced by such first feature points that the high concentration gate region HGR is included in the low concentration gate region LGR, and that the high concentration gate region HGR is not directly in contact with the channel region CH (counter doped region CNR), so that the performance of the junction FET in the present first embodiment can be improved.

Figure 4:
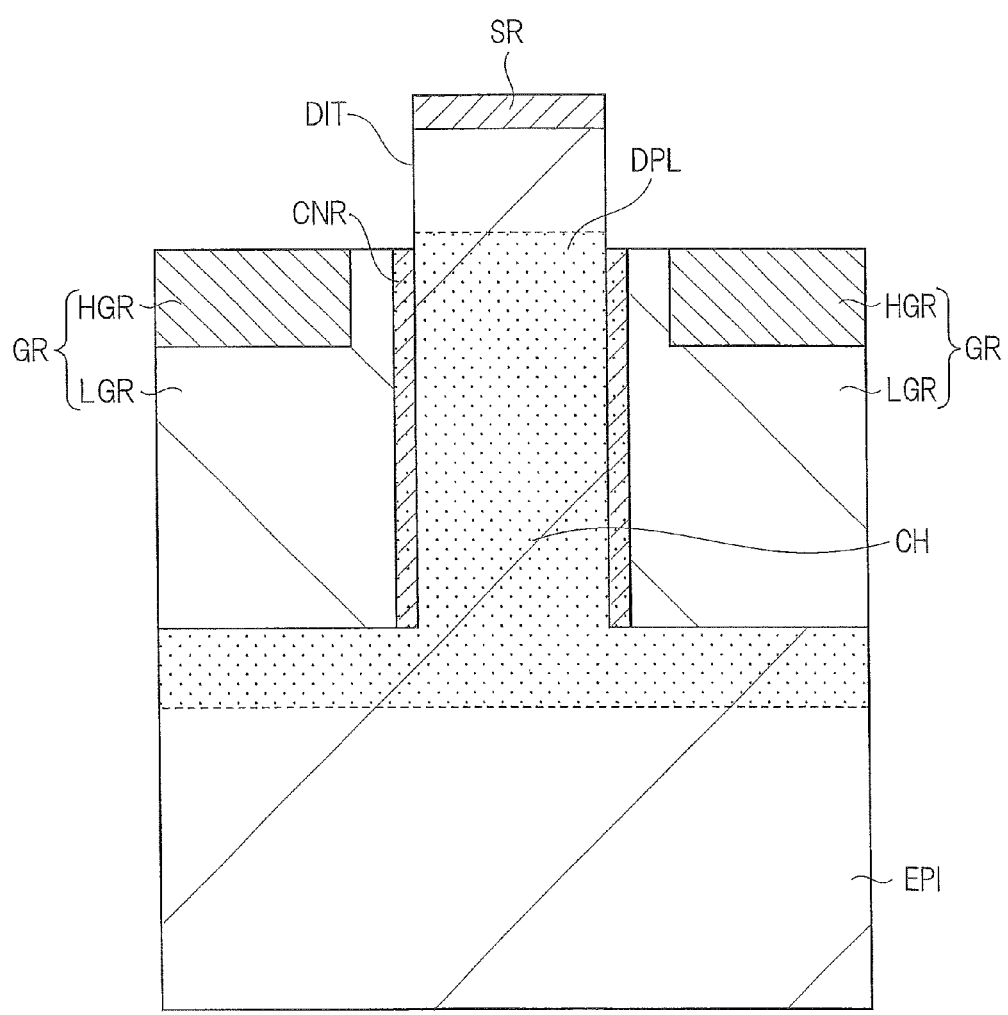
FIG. 4 is a view illustrating an off-state of the junction FET in the first embodiment.

Next, a second feature point in the present first embodiment will be described. FIG. 4 is a view illustrating the off-state of the junction FET in the present first embodiment. In FIG. 4, a lower voltage than that of the source region SR is applied to the gate region GR. In this case, a reverse bias is applied to the p-n junction formed in the boundary region between the channel region CH (counter doped region CNR) and the gate region GR. As a result, the extension of the depletion layer DPL extended from the p-n junction formed in the boundary region between the channel region CH and the gate region GR becomes large, and therefore, the depletion layers DPL extended from the pair of gate regions GR which sandwich the channel region CH are joined, so that the whole channel region CH is depleted. In FIG. 4, dots are given to the depleted region (depletion layer DPL). Since this depleted channel region CH is functioned as the insulating region, the electric current does not flow due to the depleted channel region CH even when the difference in the electric potential is generated between the drain electrode and the source region SR. In this manner, the off-state of the junction FET is achieved.

At this time, between the source region SR and the drain region, the longer a length in a vertical direction (thickness direction of the epitaxial layer EPI) of the depleted channel region CH is, the better the off-characteristics of the junction FET is. That is, the longer the length in a vertical direction of the depletion layer DPL is, the lower a leakage current which flows between the source region SR and the drain region is, and therefore, the junction FET excellent in the off-characteristics can be achieved. Accordingly, in the present first embodiment, such a devisal as achieving the junction FET which is more excellent in the off-characteristics than the junction FET illustrated in FIG. 4 has been performed.

Figure 5:
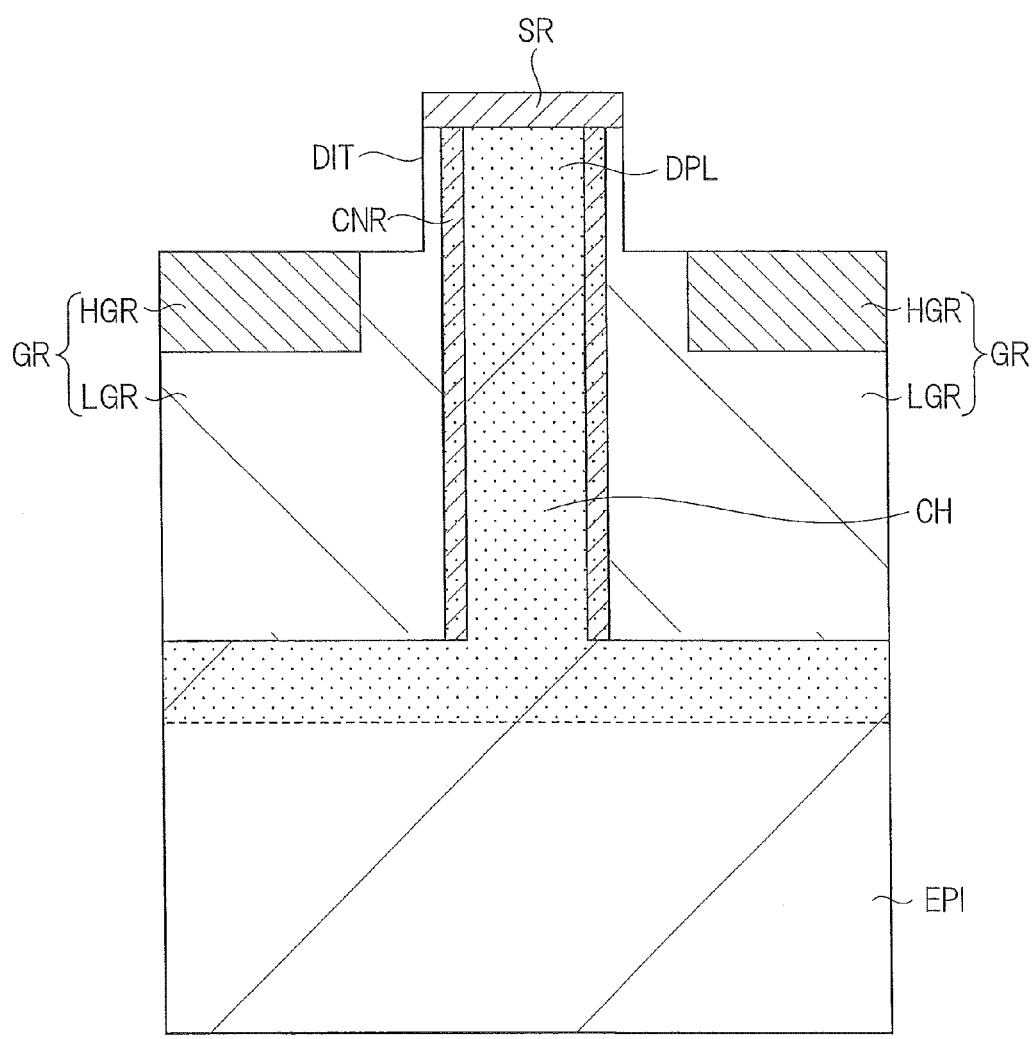
FIG. 5 is a view illustrating an off-state of the junction FET in which off-characteristics can be improved.

Hereinafter, this point will be described. FIG. 5 is a view illustrating the off-state of the junction FET in which the off-characteristics can be improved. In FIG. 5, the second feature point in the present first embodiment is that the low concentration gate region LGR is formed also in each side surface of the pair of trenches DIT. For example, in the junction FET illustrated in FIG. 5, the junction FET is turned off by applying a lower voltage than that of the source region SR to the gate region GR. In this case, a reverse bias is applied to the p-n junction formed in the boundary region between the channel region CH (counter doped region CNR) and the gate region GR. As a result, the extension of the depletion layer DPL extended from the p-n junction formed in the boundary region between the channel region CH and the gate region GR becomes large, and therefore, the depletion layers DPL extended from the pair of gate regions GR which sandwich the channel region CH are joined, so that the whole channel region CH is depleted. In FIG. 5, dots are given to the depleted region (depletion layer DPL).

Furthermore, in the junction FET illustrated in FIG. 5, the low concentration gate region LGR is formed also on the side surface of the trench DIT, and therefore, the depletion layer DPL is formed from the low concentration gate region LGR formed on the side surface of this trench DIT toward the channel region CH (counter doped region CNR). Therefore, in the junction FET illustrated in FIG. 5, the length of the depletion layer DPL in the vertical direction is longer than that of the junction FET illustrated in FIG. 4. As a result, according to the junction FET illustrated in FIG. 5, a leakage current which flows between the source region SR and the drain region can be reduced more than that of the junction FET illustrated in FIG. 4. That is, according to such a second feature point in the present first embodiment that the low concentration gate region LGR can be formed also on the side surface of the trench DIT, a remarkable effect capable of improving the off-characteristics of the junction FET can be obtained.

<Method of Manufacturing Junction FET in First Embodiment>

The junction FET in the present first embodiment is constituted as described above, and a method of manufacturing the junction FET will be described below with reference to drawings.

Figure 6:
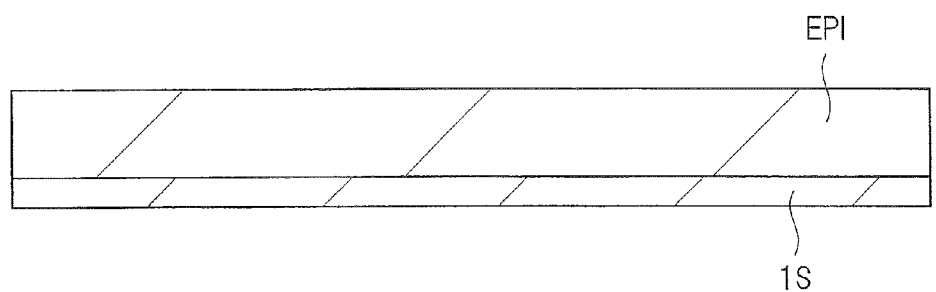
FIG. 6 is a cross-sectional view illustrating a process of manufacturing a semiconductor device in the first embodiment.

First, as illustrated in FIG. 6, for example, the semiconductor substrate 1S where the epitaxial layer EPI is formed on the main surface (front surface) is prepared. The semiconductor substrate 1S is made up from, for example, a material containing the silicon carbide as the main component, and the epitaxial layer EPI is made up from, for example, the n-type semiconductor layer with the n-type impurity represented by nitrogen introduced into the silicon carbide.

Figure 7:
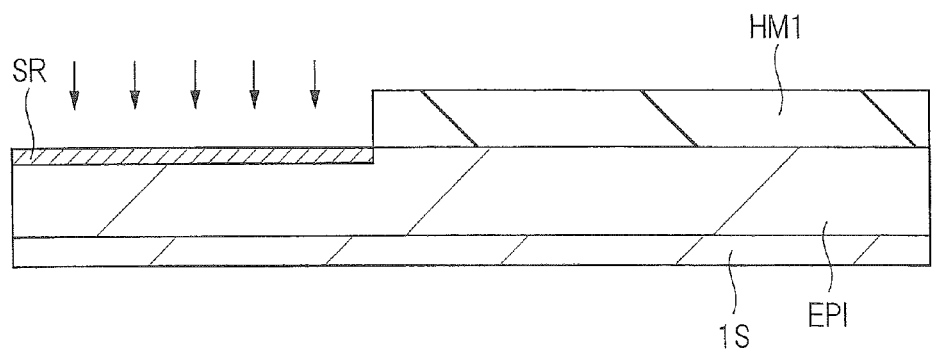
FIG. 7 is a cross-sectional view illustrating the process of manufacturing the semiconductor device, continued from FIG. 6.

Next, as illustrated in FIG. 7, the source region SR is formed on the surface of the epitaxial layer EPI. Specifically, for example, a hard mask film HM1 made up from the silicon oxide film is formed on the surface of the epitaxial layer EPI, and then, the hard mask film HM1 is patterned by using a photolithography technique and an etching technique. The hard mask film HM1 is patterned so as to expose a source formation region. Then, the source region SR that is the n-type semiconductor region is formed by an ion implantation method using the patterned hard mask film HM1 used as a mask. The source region SR is formed by introducing, for example, nitrogen into a surface layer part of the epitaxial layer EPI by the ion implantation method.

Figure 8:
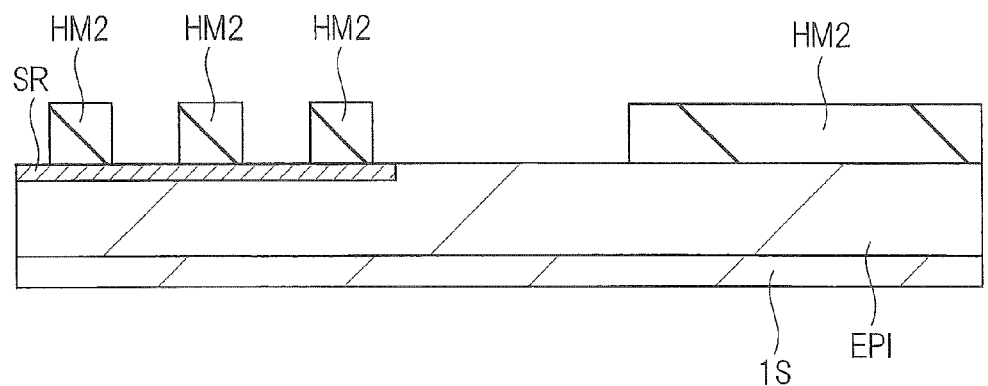
FIG. 8 is a cross-sectional view illustrating the process of manufacturing the semiconductor device, continued from FIG. 7.
Figure 9:
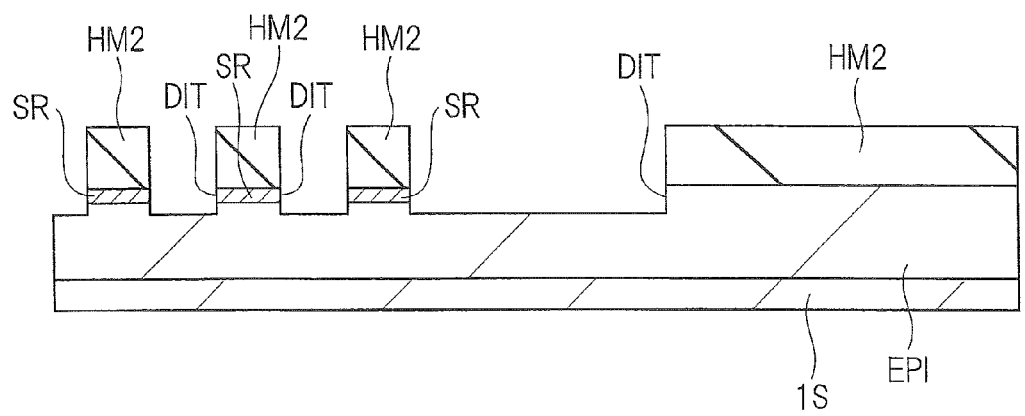
FIG. 9 is a cross-sectional view illustrating the process of manufacturing the semiconductor device, continued from FIG. 10.

Next, the patterned hard mask film HM1 is removed, and then, for example, a hard mask film HM2 made up from the silicon oxide film is formed on the surface of the epitaxial layer EPI as illustrated in FIG. 8, and then, the hard mask film HM2 is patterned by using the photolithography technique and the etching technique. The hard mask film HM2 is patterned so as to expose a trench formation region. Then, as illustrated in FIG. 9, a plurality of trenches DIT are formed in the epitaxial layer EPI by the etching technique using the patterned hard mask film HM2 used as a mask. Each depth of these trenches DIT is formed so as to become deeper than the depth of the source region SR. That is, the plurality of trenches DIT are formed so as to penetrate through the integrally-formed source region SR, and the integrally-formed source region SR is separated into a plurality of source regions SR by each of the plurality of trenches DIT. As a result, the trenches DIT are formed so as to sandwich the source region SR. Then, the region which is the lower layer of the source region SR and which is the epitaxial layer EPI sandwiched by the pair of trenches DIT becomes the channel region CH.

Figure 10:
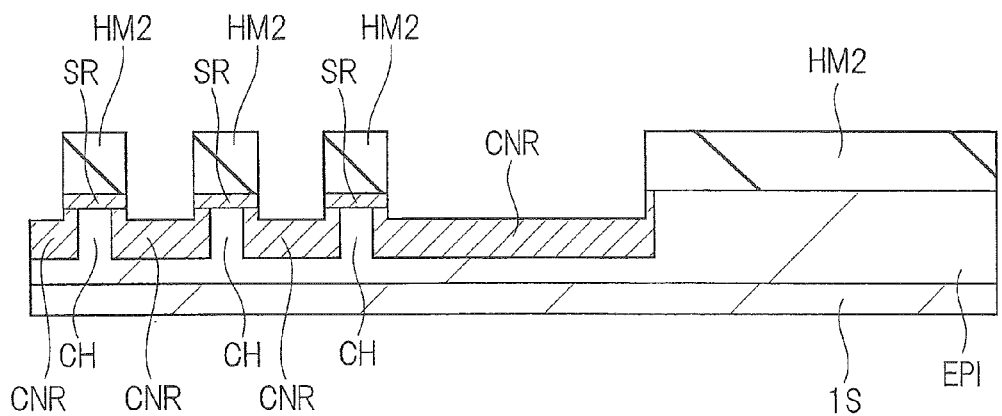
FIG. 10 is a cross-sectional view illustrating the process of manufacturing the semiconductor device, continued from FIG. 9.

Next, as illustrated in FIG. 10, the counter doped region CNR that is the n-type semiconductor region is formed below the bottom of the trench DIT by the ion implantation method (for example, perpendicular ion implantation method) using the patterned hard mask film HM2 used as a mask. The counter doped region CNR is formed by introducing, for example, the n-type impurity represented by nitrogen into the epitaxial layer EPI. At this time, the counter doped region CNR is formed not only below the bottom of the trench DIT but also on the side surface of the trench DIT.

Figure 11:
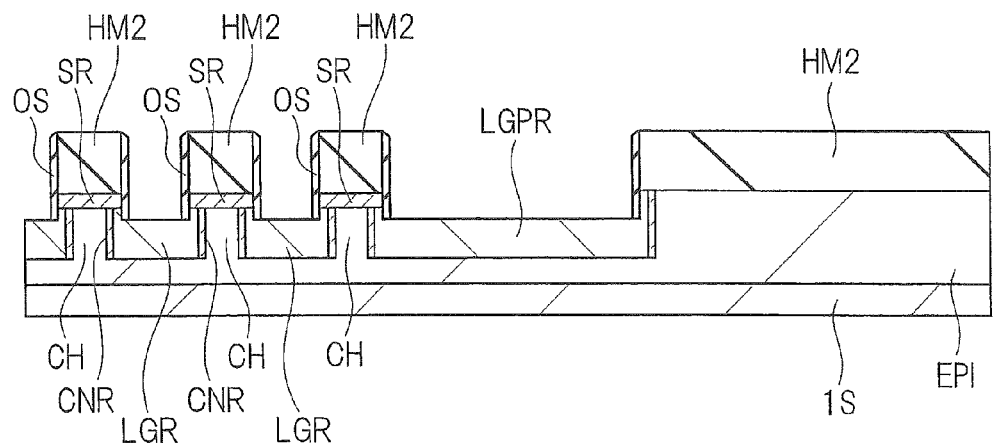
FIG. 11 is a cross-sectional view illustrating the process of manufacturing the semiconductor device, continued from FIG. 10.

Then, as illustrated in FIG. 11, an insulating film made up from, for example, the silicon oxide film is formed so as to cover the patterned hard mask film HM2, and this insulating film is subjected to anisotropic etching, so that an offset spacer OS is formed on side surfaces of the hard mask film HM2 and the trench DIT. Then, the low concentration gate region LGR and low concentration gate lead-out region LGPR that are the p-type semiconductor region are formed by the ion implantation method (for example, perpendicular ion implantation method) using the hard mask film HM2 with the offset spacer OS formed on the side surface thereof as a mask. The low concentration gate region LGR and the low concentration gate lead-out region LGPR are formed by introducing, for example, the p-type impurity represented by aluminum into the epitaxial layer EPI.

At this time, since the offset spacer OS is formed on the side surface of the hard mask film HM2, a width of the low concentration gate region LGR becomes narrower than a width of the counter doped region CNR. As a result, the counter doped region CNR is interposed between the channel region CH and the low concentration gate region LGR, so that a concentration profile of the p-n junction formed in the boundary region between the low concentration gate region LGR and the channel region CH can be steep. Note that, the low concentration gate region LGR is also formed not only below the bottom of the trench DIT but also on the side surface of the trench.

Figure 12:
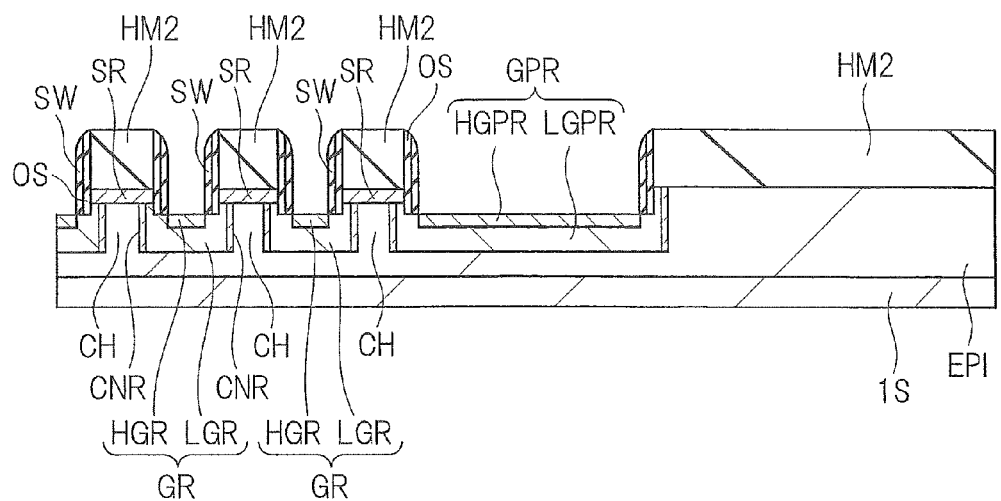
FIG. 12 is a cross-sectional view illustrating the process of manufacturing the semiconductor device, continued from FIG. 11.

Next, as illustrated in FIG. 12, an insulating film made up from, for example, the silicon oxide film is formed so as to cover the hard mask film HM2 with the offset spacer OS formed on the side surface thereof, and this insulating film is subjected to anisotropic etching, so that a side wall spacer SW is formed on side surfaces of the hard mask film HM2 and the trench DIT. Then, the high concentration gate region HGR and high concentration gate lead-out region HGPR that are the p-type semiconductor regions are formed by the ion implantation method (for example, perpendicular ion implantation method) using the hard mask film HM2 with the offset spacer OS and side wall spacer SW formed on the side surface thereof as a mask. The high concentration gate region HGR and the high concentration gate lead-out region HGPR are formed by introducing, for example, the p-type impurity represented by aluminum into the epitaxial layer EPI. Note that the impurity concentration of the high concentration gate region HGR is higher than the impurity concentration of the low concentration gate region LGR. Similarly, the impurity concentration of the high concentration gate lead-out region HGPR is higher than the impurity concentration of the low concentration gate lead-out region LGPR. In this manner, the gate region GR made up from the low concentration gate region LGR and the high concentration gate region HGR, and the gate lead-out region GPR made up from the low concentration gate lead-out region LGPR and the high concentration gate lead-out region HGPR can be formed.

Here, since the side wall spacer SW is formed on the side surface of the hard mask film HM2, a width of the high concentration gate region HGR becomes narrower than a width of the low concentration gate region LGR. From this, the high concentration gate region HGR is formed so as to be included in the low concentration gate region LGR. In this manner, in the method of manufacturing the junction FET in the present first embodiment, the configuration by the first feature points is achieved, the first feature point being that the high concentration gate region HGR is included in the low concentration gate region LGR, and that the high concentration gate region HGR is not directly in contact with the channel region CH (counter doped region CNR).

In the method of manufacturing the junction FET in the present first embodiment, the side wall spacer SW is formed on the side surface of the hard mask film HM2, and the high concentration gate region HGR is formed so as to be self-aligned with this side wall spacer SW. From this, according to the present first embodiment, the high concentration gate region HGR included in the low concentration gate region LGR can be formed without requiring accuracy of mask alignment. Therefore, it is not required to secure a margin for the accuracy of the mask alignment, and an advantage that a density of the junction FET can be increased is obtained.

In this manner, in the method of manufacturing the junction FET in the present first embodiment, the trench DIT aligned with the source region SR is formed first by the etching technique using the patterned hard mask film HM2 as a mask, and the counter doped region CNR is formed by the ion implantation method using this hard mask film HM2 as a mask. Then, by the ion implantation method in a state that the offset spacer OS is formed on the side surface of the hard mask film HM2, the low concentration gate region LGR is formed. Furthermore, by the ion implantation method in a state that the side wall spacer SW is formed on the side surface of the hard mask film HM2 with the offset spacer OS formed thereon, the high concentration gate region HGP is formed. Therefore, by basically using the same hard mask film HM2, the trench DIT, the counter doped region CNR, the low concentration gate region LGR and the high concentration gate region HGR are formed. From this, the trench DIT, the counter doped region CNR, the low concentration gate region LGR and the high concentration gate region HGR can be formed so as to be self-aligned with the source region SR. That is, according to the method of manufacturing the junction FET in the present first embodiment, different masks are not used to form the trench DIT, the counter doped region CNR, the low concentration gate region LGR and the high concentration gate region HGR, and therefore, it is not required to secure a margin in consideration of an alignment shift in the case of using the different masks, and the junction FETs which are adjacent to each other can be arranged with a high density. That is, according to the method of manufacturing the junction FET in the present first embodiment, the configuration of the first feature point that the high concentration gate region HGR is included in the low concentration gate region LGR can be achieved with supporting the high density of the junction FET.

Figure 13:
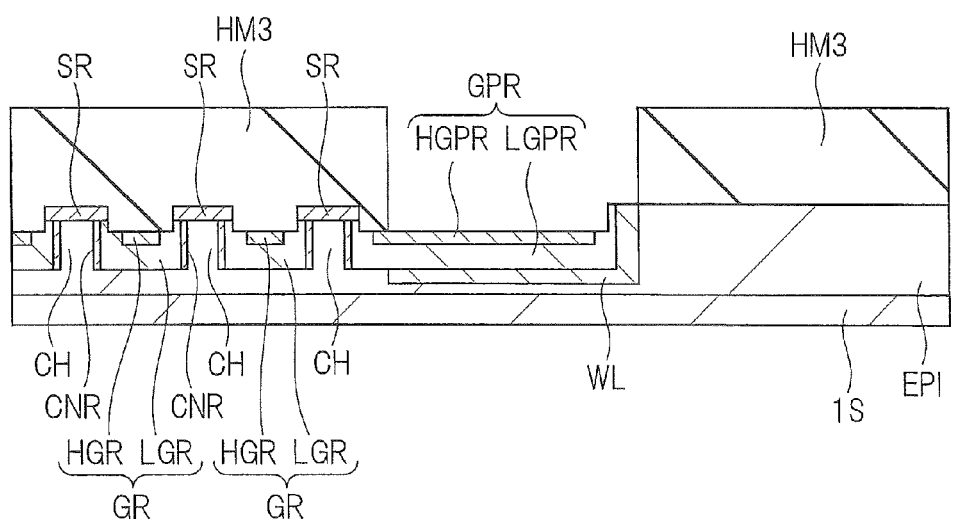
FIG. 13 is a cross-sectional view illustrating the process of manufacturing the semiconductor device, continued from FIG. 12.

Next, after removing the hard mask film HM2 with the offset spacer OS and the side wall spacer SW formed on the side surface thereof, a hard mask film HM3 made up from, for example, the silicon oxide film is formed on the surface of the epitaxial layer EPI as illustrated in FIG. 13. Then, the hard mask film HM3 is patterned by using the photolithography technique and the etching technique. The hard mask film HM3 is patterned so as to expose a well formation region. Then, the well WL which is in contact with the gate lead-out region GPR is formed by the ion implantation method using the patterned hard mask film HM3 as a mask. This well WL is made up from, for example, the p-type semiconductor region with the p-type impurity represented by aluminum introduced into the silicon carbide.

Figure 14:
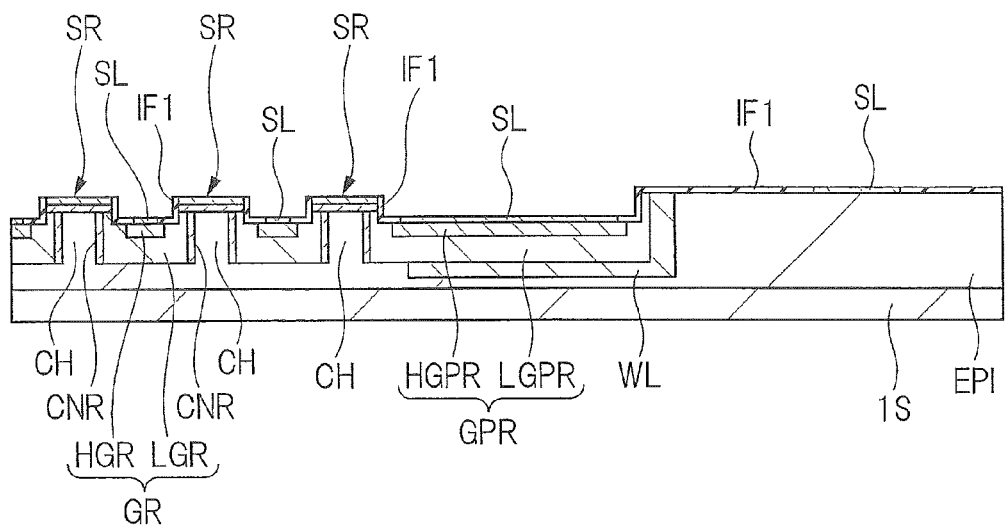
FIG. 14 is a cross-sectional view illustrating the process of manufacturing the semiconductor device, continued from FIG. 12.

Next, after removing the patterned hard mask film H3, the silicide layer SL is formed on the high concentration gate region HGR as illustrated in FIG. 14, and the silicide layer SL is formed on the high concentration gate lead-out region HGPR. Similarly, the silicide layer SL is formed also in a guard ring formation region which exists in the outside of the gate lead-out region GPR. Furthermore, the silicide layer SL is formed also in the source region SR. Specifically, after forming the insulating film IF1 made up from, for example, the silicon oxide film on the surface of the epitaxial layer EPI, the insulating film IF1 is patterned by using the photolithography technique and the etching technique. The insulating film IF1 is patterned so as to expose a silicide layer formation region. That is, an upper surface of the source region SR, an upper surface of the high concentration gate region HGR, an upper surface of the high concentration gate lead-out region HGPR and an upper surface of the guard ring formation region are exposed from the insulating film IF1. Then, a nickel (Ni) film is made to be formed by using, for example, a sputtering method so as to cover the patterned insulating film IF1. In this manner, the nickel film is directly in contact with the upper surface of the source region SR, the upper surface of the high concentration gate region HGR, the upper surface of the high concentration gate lead-out region HGPR and the upper surface of the guard ring formation region. Then, the silicide layer SL is formed by applying annealing (heat treatment) for generating a silicide state. In this manner, the silicide layer SL can be formed on the high concentration gate region HGR, and the silicide layer SL can be formed on the high concentration gate lead-out region HGPR. Similarly, the silicide layer SL can be formed also in the guard ring formation region. Furthermore, the silicide layer SL can be formed also in the source region SR.

Figure 15:
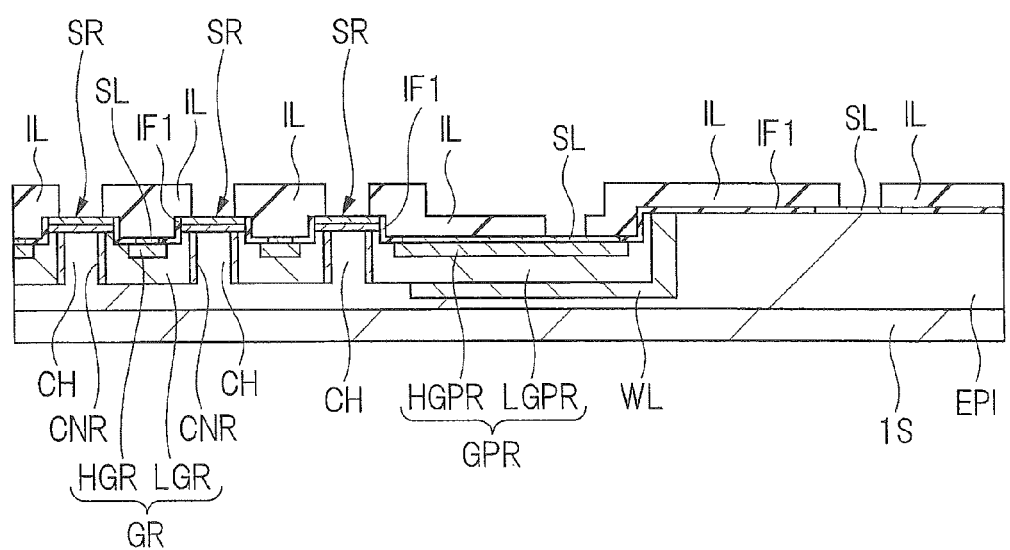
FIG. 15 is a cross-sectional view illustrating the process of manufacturing the semiconductor device, continued from FIG. 14.

Next, as illustrated in FIG. 15, the interlayer insulating film IL made up from, for example, the silicon oxide film is formed on the epitaxial layer EPI. Then, the interlayer insulating film IL is patterned by using the photolithography technique and the etching technique. The interlayer insulating film IL is patterned so as to open the source region SR, and open a part of the silicide layer SL formed on the high concentration gate lead-out region HGPR, and open a part of the silicide layer SL formed in the guard ring formation region.

Figure 16:
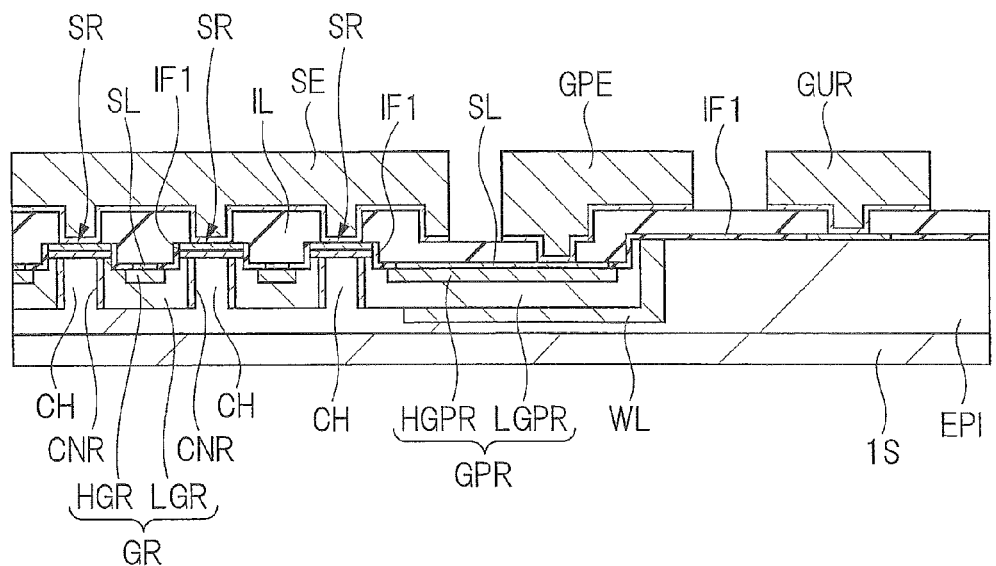
FIG. 16 is a cross-sectional view illustrating the process of manufacturing the semiconductor device, continued from FIG. 15.

Then, as illustrated in FIG. 16, a barrier conductor film made up from the titanium film and the titanium nitride film is formed by using, for example, the sputtering method so as to cover the patterned interlayer insulating film IL, and the aluminum film is formed on this barrier conductor film. Then, a laminated film made up from the barrier conductor film and the aluminum film is patterned by using the photolithography technique and the etching technique, so that the source electrode SE electrically connected with the source region SR is formed. Similarly, the gate lead-out electrode GPE electrically connected with the gate lead-out region GPR is formed, and besides, the guard ring GUR electrically connected with the silicide layer SL formed in the guard ring formation region is formed.

Figure 17:
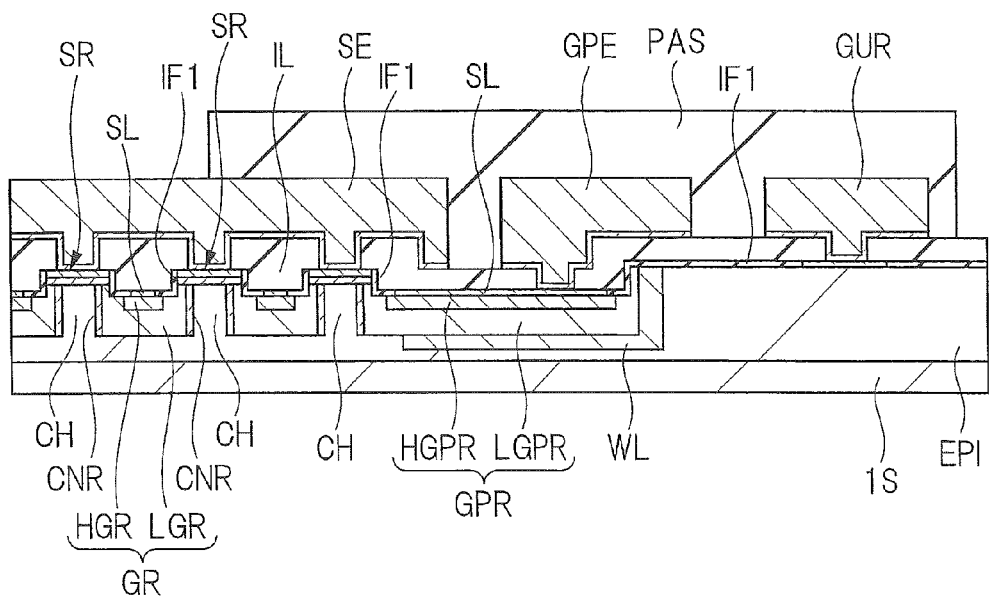
FIG. 17 is a cross-sectional view illustrating the process of manufacturing the semiconductor device, continued from FIG. 16.

Next, as illustrated in FIG. 17, a surface protection film PAS made up from, for example, the polyimide resin film is formed so as to cover the source electrode SE, the gate lead-out electrode GPE and the guard ring GUR. In such a manner as described above, the junction FET in the present first embodiment can be manufactured.

(Second Embodiment)

In the above-described first embodiment, the example of the formation of the high concentration gate region HGR has been described, the formation being achieved by forming the low concentration gate region LGR with the offset spacer OS formed on the side surface of the hard mask film HM2, and besides, forming the side wall spacer SW in the outside of the offset spacer OS. In the present second embodiment, an example of formation of the low concentration gate region LGR and the high concentration gate region HGR by using different hard mask films will be described.

Figure 18:
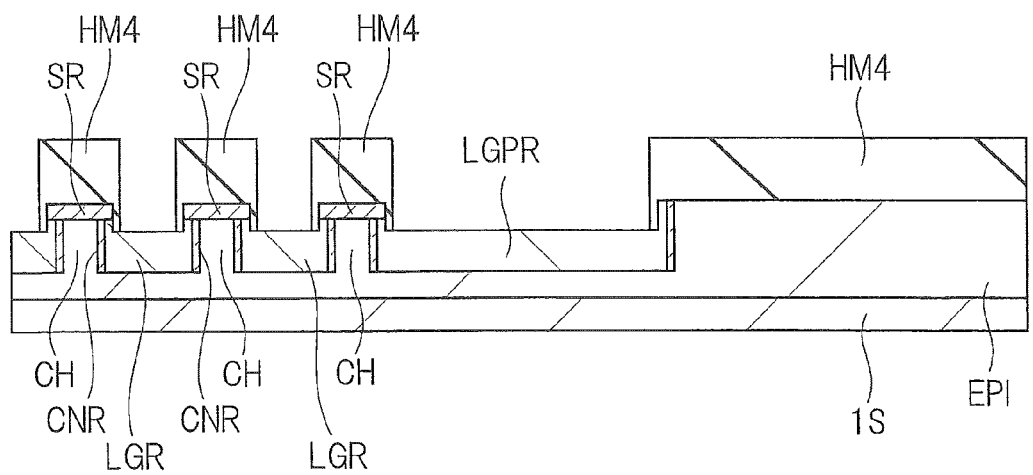
FIG. 18 is a cross-sectional view illustrating a process of manufacturing a semiconductor device in a second embodiment.

First, as illustrated in FIG. 18, a hard mask film HM4 is formed on the epitaxial layer EPI with the trench DIT formed. Then, the hard mask film HM4 is patterned by using the photolithography technique and the etching technique. The hard mask film HM4 is patterned so as to have an opening narrower than the opening of the hard mask film HM2 illustrated in FIG. 10. Then, by the ion implantation method using the patterned hard mask film HM4 as a mask, the low concentration gate region LGR and the low concentration gate lead-out region LGPR are formed. At this time, since the opening of the hard mask film HM4 illustrated in FIG. 18 is narrower than the opening of the hard mask film HM2 illustrated in FIG. 10, the width of the low concentration gate region LGR is formed so as to become narrower than the width of the counter doped region CNR as illustrated in FIG. 18.

Figure 19:
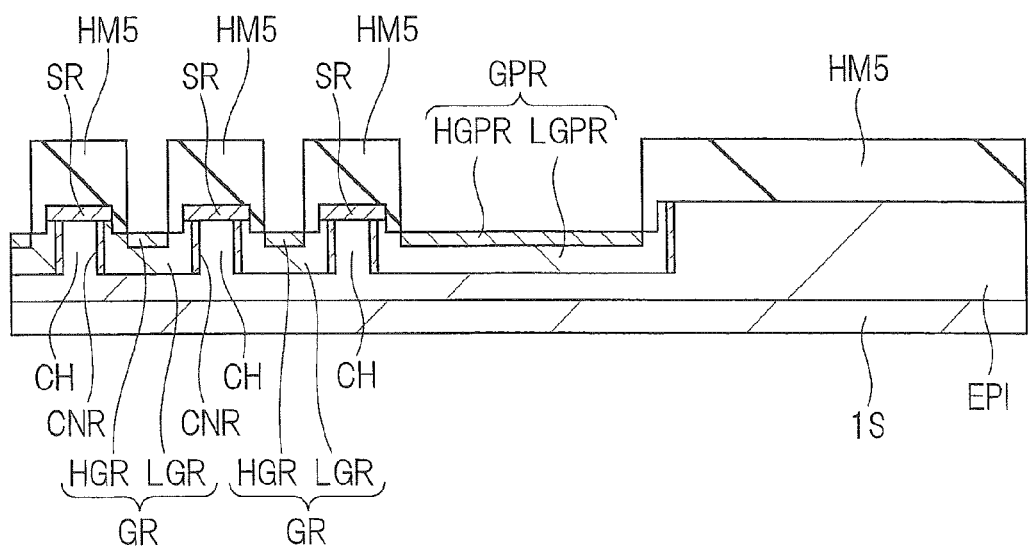
FIG. 19 is a cross-sectional view illustrating the process of manufacturing the semiconductor device, continued from FIG. 18.

Next, as illustrated in FIG. 19, a hard mask film HM5 which opens a region narrower than the formation region of the low concentration gate region LGR is formed, and the high concentration gate region HGR and the high concentration gate lead-out region HGPR are formed below each bottom of the pair of trenches DIT by using this hard mask film HM5 as a mask. Specifically, the hard mask film HM5 is formed on the epitaxial layer EPI with the trenches DIT formed, and the hard mask film HM5 is patterned by using the photolithography technique and the etching technique. The hard mask film HM5 is patterned so as to have an opening narrower than the opening of the hard mask film HM4 illustrated in FIG. 18. Then, by the ion implantation method using the patterned hard mask film HM5 as a mask, the high concentration gate region HGR and the high concentration gate lead-out region HGPR are formed. In this manner, also in the method of manufacturing the junction FET in the present second embodiment, the configuration of the first feature points are achieved, the first feature points being that the high concentration gate region HGR is included in the low concentration gate region LGR, and that the high concentration gate region HGR is not directly in contact with the channel region CH (counter doped region CNR). Subsequent processes are the same as those of the above-described first embodiment. In such a manner as described above, the junction FET in the present second embodiment can be manufactured.

(Third Embodiment)

In the present third embodiment, an example of formation of the low concentration gate region LGR and the high concentration gate region HGR by an ion implantation method changing an implantation angle will be described.

Figure 20:
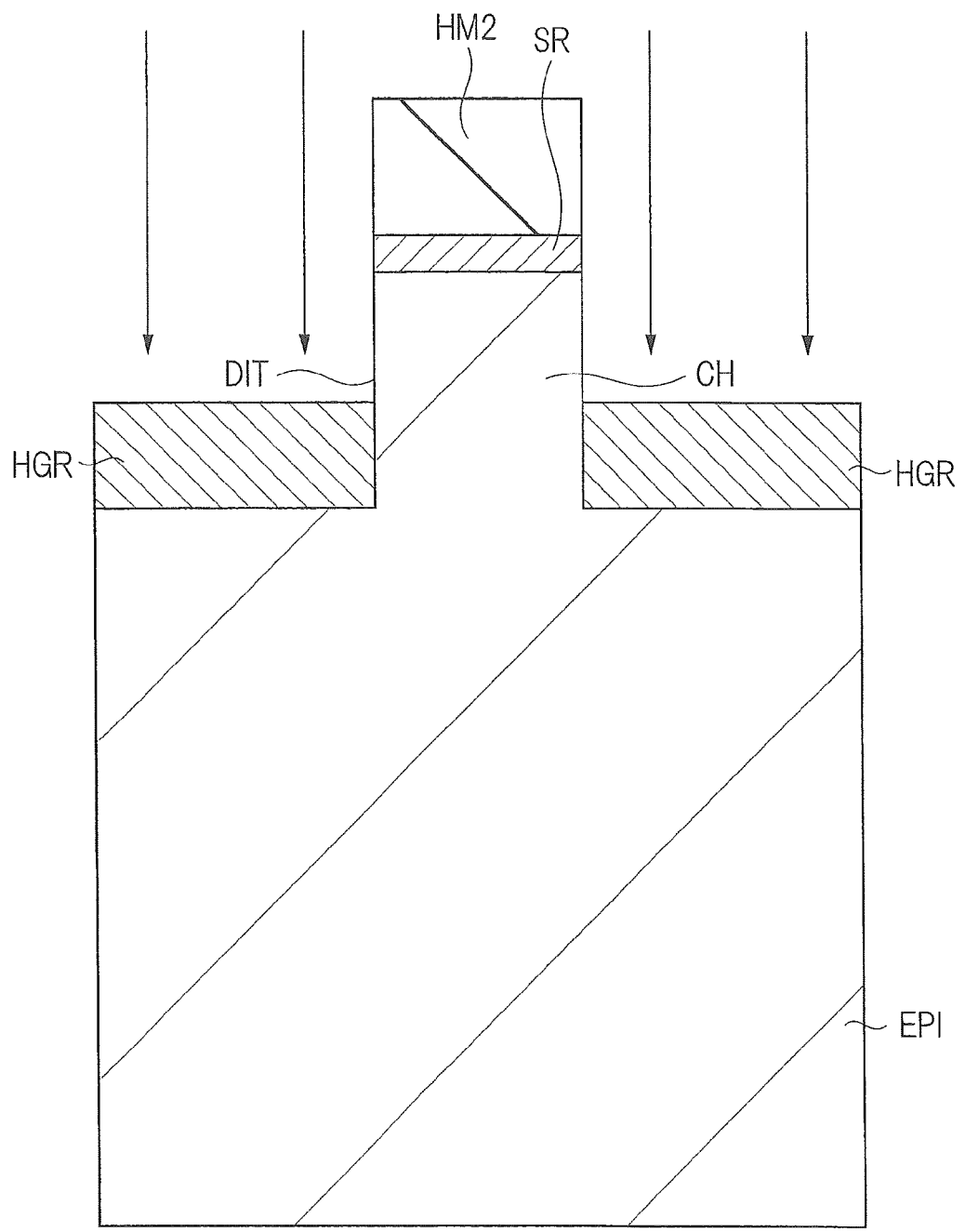
FIG. 20 is a cross-sectional view illustrating a process of manufacturing a semiconductor device in a third embodiment.
Figure 21:
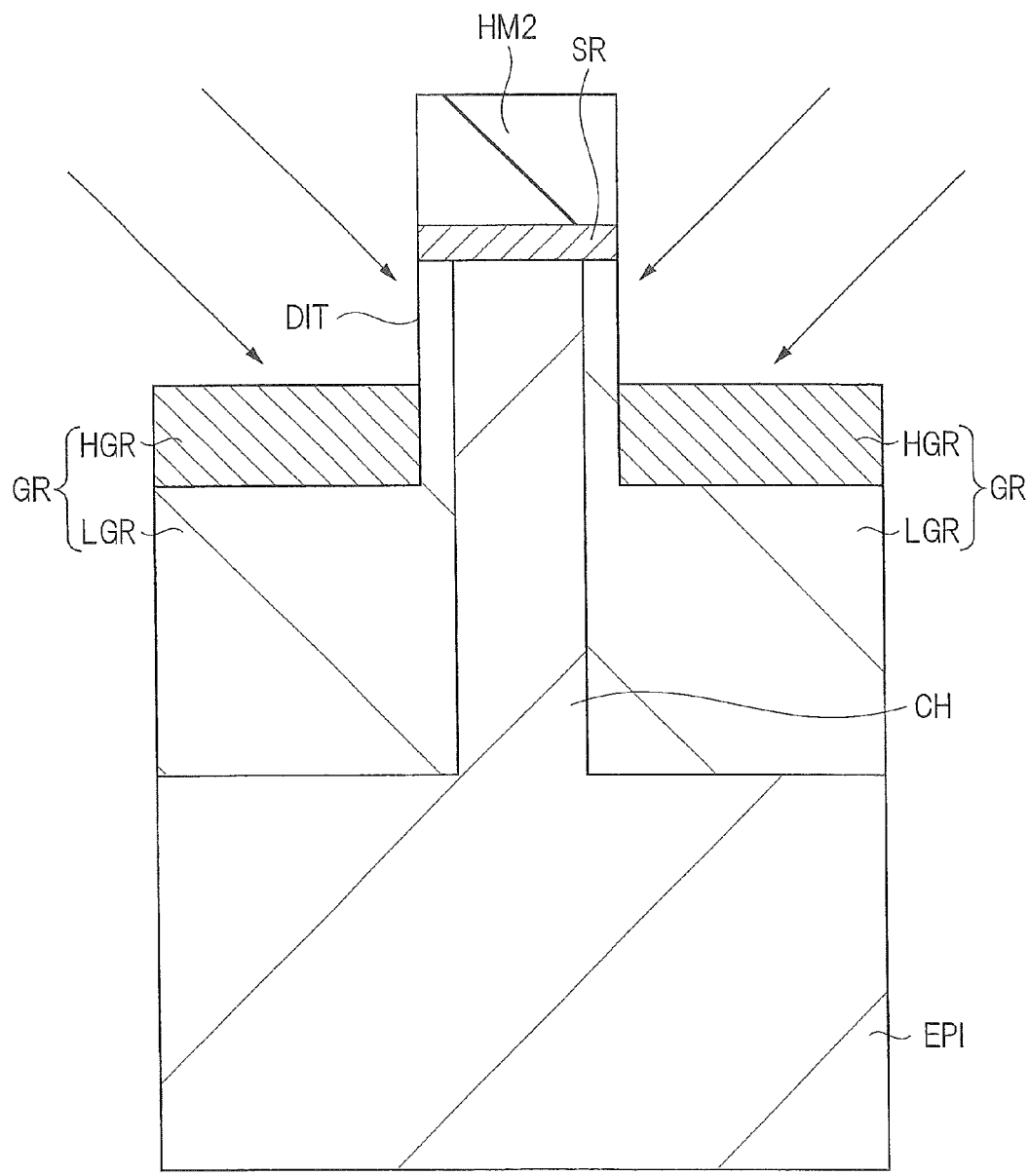
FIG. 21 is a cross-sectional view illustrating the process of manufacturing the semiconductor device, continued from FIG. 20.

First, as illustrated in FIG. 20, the high concentration gate region HGR is formed by the perpendicular ion implantation method using the hard mask film HM2 as a mask as it is used for the formation of the trenches DIT. Then, as illustrated in FIG. 21, the low concentration gate region LGR is formed by an inclined ion implantation method using the hard mask film HM2 as a mask as it is. In this manner, also in the method of manufacturing the junction FET in the present third embodiment, the configuration of the first feature points can be achieved, the first feature points being that the high concentration gate region HGR is included in the low concentration gate region LGR, and that the high concentration gate region HGR is not directly in contact with the channel region CH (counter doped region CNR). Subsequent processes after that are the same as those of the above-described first embodiment. In such a manner as described above, the junction FET in the present third embodiment can be manufactured. Here, in the present third embodiment, the example of the formation of the low concentration gate region LGR by the inclined ion implantation method after the formation of the high concentration gate region HGR by the perpendicular ion implantation method has been described. However, a technical idea of the present third embodiment is not limited to this, and the present third embodiment may be configured so that, for example, the high concentration gate region HGR is formed by the perpendicular ion implantation method after the formation of the low concentration gate region LGR by the inclined ion implantation method.

As an advantage of the method of manufacturing the junction FET in the present third embodiment compared with that of the above-described first embodiment, note that a point that the first feature points can be achieved without the formation of the offset spacer OS and the side wall spacer SW can be cited. Similarly, as an advantage of the method of manufacturing the junction FET in the present third embodiment compared with that of the above-described second embodiment, a point that the first feature points can be achieved without the formation of the plurality of different hard mask films can be cited. That is, the method of manufacturing the junction FET in the present third embodiment can obtain an advantage that the configurations of the first feature points and the second feature point can be achieved by simplified processes as compared with those of the above-described first embodiment and the above-described second embodiment.

(Fourth Embodiment)

In the present fourth embodiment, an example of formation of the high concentration gate region HGR is formed by the ion implantation method in a deposition state of insulating films will be described.

Figure 22:
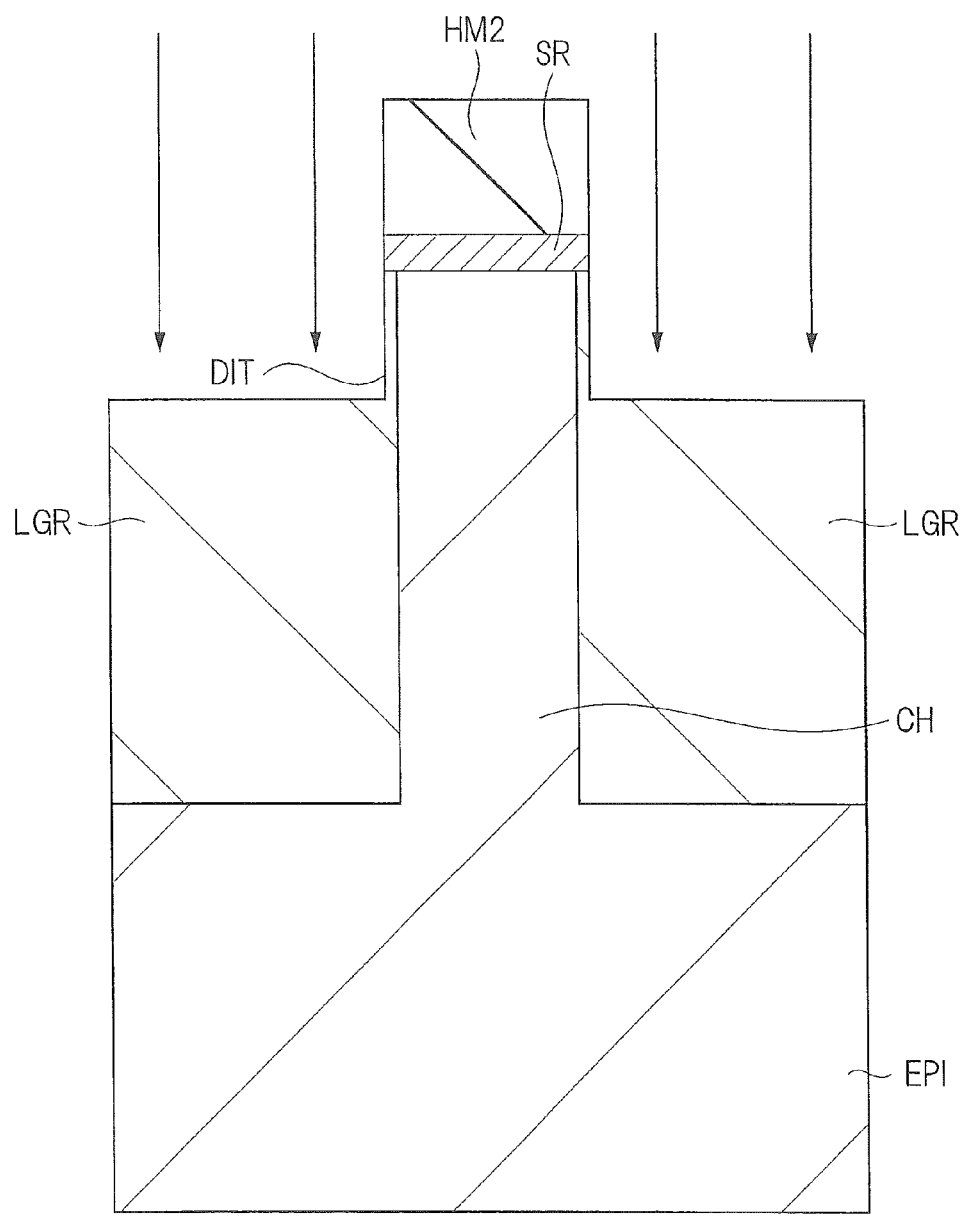
FIG. 22 is a cross-sectional view illustrating a process of manufacturing a semiconductor device in a fourth embodiment.

First, as illustrated in FIG. 22, the low concentration gate region LGR is formed by the ion implantation method (for example, perpendicular ion implantation method) using the hard mask film HM2 used in the formation of trench DIT a mask as it is.

Figure 23:
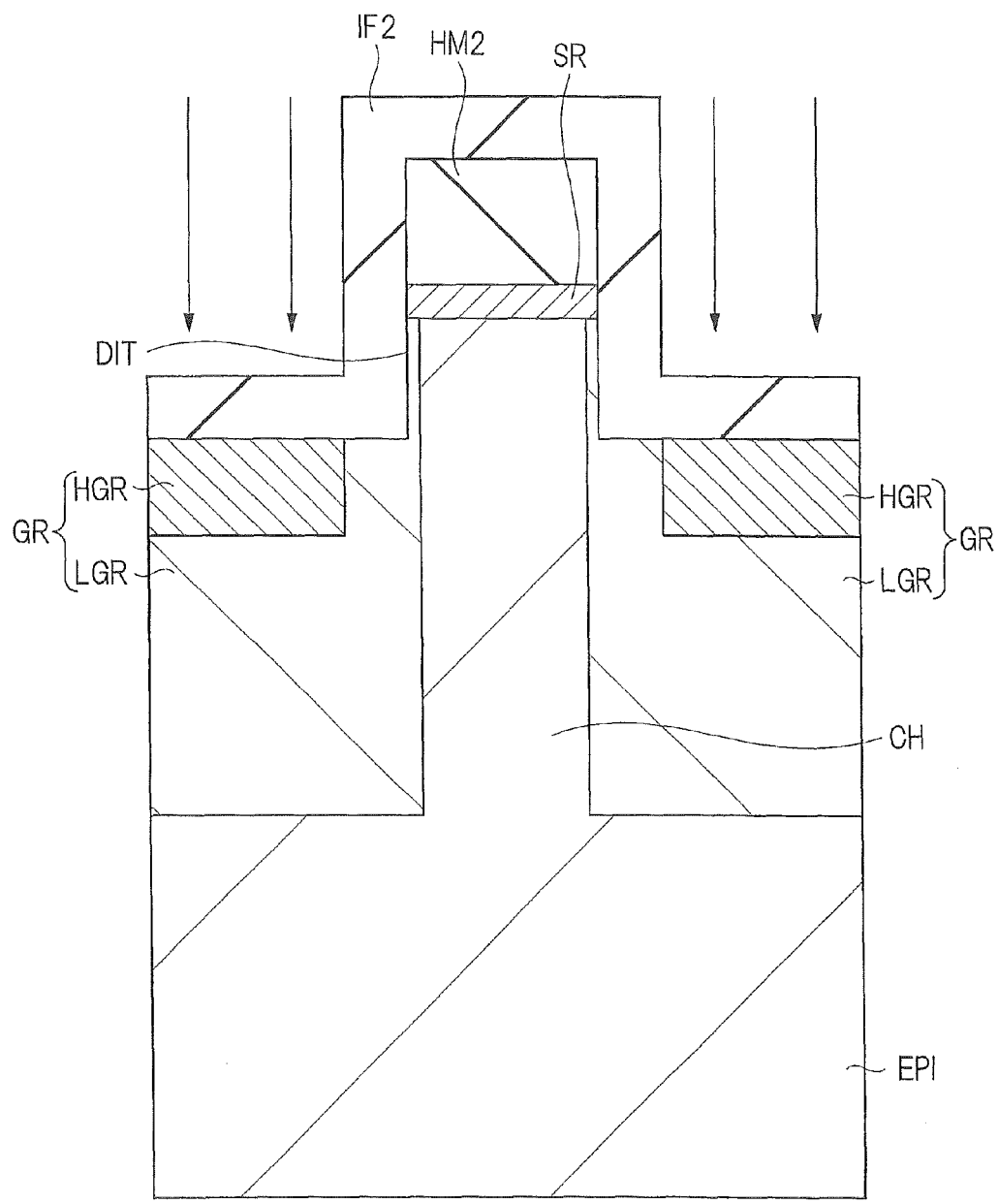
FIG. 23 is a cross-sectional view illustrating the process of manufacturing the semiconductor device, continued from FIG. 22.

Then, as illustrated in FIG. 23, the insulating film IF2 is formed on the epitaxial layer EPI with the trench DIT formed thereon. Then, the high concentration gate region HGR is formed by the ion implantation method (for example, perpendicular ion implantation method) in a state of the formation of this insulating film IF2. That is, the insulating film IF2 extending from the upper surface of the hard mask film HM2 to each inner wall of the pair of trenches DIT formed, and then, the high concentration gate region HGR is formed below each bottom of the pair of trenches DIT with the insulating film IF2 formed on each inner wall thereof. At this time, as illustrated in FIG. 23, as a result of increase in an effective film thickness of the insulating film IF2 in the vicinity of each side surface of the trenches DIT, the ion implantation is not performed in a region in the vicinity of each side surface of the trenches DIT. In this manner, also in the method of manufacturing the junction FET in the present fourth embodiment, the configuration of the first feature points can be achieved, the first feature points being that the high concentration gate region HGR is included in the low concentration gate region LGR, and that the high concentration gate region HGR is not directly in contact with the channel region CH (counter doped region CNR). Subsequent processes after that are the same as those of the above-described first embodiment. In such a manner as described above, the junction FET in the present fourth embodiment can be manufactured.

The method of manufacturing the junction FET in the present fourth embodiment can obtain an advantage that the configurations of the first feature points and the second feature point can be achieved by the simpler processes than those of the above-described first embodiment since the process of the formation of the side wall spacer SW is formed by applying the anisotropic etching to the deposited insulating film IF2 can be eliminated.

In the foregoing, the invention made by the present inventor has been concretely described based on the embodiments. However, it is needless to say that the present invention is not limited to the foregoing embodiments and various modifications and alterations can be made within the scope of the present invention.

In the above-described embodiments, the junction FET which contains the silicon carbide as the main component has been described as the example. However, the new technical idea described in the present specification is not limited to this, and can be applied widely also to, for example, a junction FET which contains silicon as the main component.

What is claimed is:

1. A semiconductor device, comprising:
a junction field effect transistor, wherein the junction field effect transistor includes:
a channel region of a first conductivity type as a current passage;
a pair of gate regions of a second conductivity type opposite to the first conductivity type, formed so as to sandwich the channel region therebetween; and
a source region disposed on an upper surface of the channel region,
wherein each of the pair of gate regions includes:
a low concentration gate region; and
a high concentration gate region whose impurity concentration is higher than an impurity concentration of the low concentration gate region,
wherein the high concentration gate region is included in the low concentration gate region,
wherein, in a plan view, with respect to a centerline of the channel region, outer edges of the source region are located between inner edges of the low concentration gate regions of the pair of gate regions, and
wherein the channel region extends, with a uniform concentration, from an area between the pair of gate regions to a bottom surface of the low concentration gate region.

2. The semiconductor device according to claim 1, wherein the high concentration gate region is not in contact with the channel region.

3. The semiconductor device according to claim 1, wherein a part of the low concentration gate region is interposed between the channel region and the high concentration gate region.

4. The semiconductor device according to claim 1, wherein a bottom surface of the high concentration gate region is formed at a position shallower than a bottom surface of the low concentration gate region.

5. The semiconductor device according to claim 1, wherein a silicide layer is formed on the high concentration gate region.

6. The semiconductor device according to claim 1, wherein the channel region includes a semiconductor region formed by introducing an impurity of the first conductivity type into silicon carbide, and
wherein said each of the pair of gate regions includes another semiconductor region formed by introducing an impurity of the second conductivity type into silicon carbide.

7. The semiconductor device according to claim 1, wherein a counter doped region of the first conductivity type is formed between the low concentration gate region and the channel region.

8. The semiconductor device according to claim 1, wherein the junction field effect transistor further includes:
a semiconductor substrate;
an epitaxial layer formed on the semiconductor substrate;
the source region formed on a surface of the epitaxial layer;
the channel region formed in a lower layer of the source region;
a pair of trenches formed in the epitaxial layer so as to sandwich the source region therebetween; and
the pair of gate regions formed below a bottom of the pair of trenches.

9. The semiconductor device according to claim 8, wherein, in the plan view, the low concentration gate region overlaps with the pair of trenches.

10. The semiconductor device according to claim 1, wherein the junction field effect transistor further includes:
a pair of trenches extending from the outer edges of the source region to upper surfaces of the low concentration gate regions, bottom surfaces of the trenches being disposed on the upper surfaces of the low concentration gate regions.

11. The semiconductor device according to claim 10, wherein the junction field effect transistor further includes:
a counter doped region of the first conductivity type disposed between the low concentration gate region and the channel region, and
wherein a top surface of the counter doped region is located under the bottom surfaces of the trenches.

* * * * *